United States Patent [19]

Ohno et al.

[11] Patent Number: 4,716,491

[45] Date of Patent: Dec. 29, 1987

[54] HIGH FREQUENCY PLASMA GENERATION APPARATUS

[75] Inventors: Yasunori Ohno; Tomoe Kurosawa, both of Hitachi; Tadashi Sato, Mito; Youichi Ohshita, Hitachi, all of Japan

[73] Assignee: Hitachi, Ltd., Tokyo, Japan

[21] Appl. No.: 806,341

[22] Filed: Dec. 9, 1985

[30] Foreign Application Priority Data

Dec. 11, 1984 [JP] Japan .................. 59-259884

[51] Int. Cl.⁴ .................................... H05H 1/16
[52] U.S. Cl. .................... 361/230; 204/192.34; 315/111.71
[58] Field of Search .............. 356/316; 313/231.31, 313/231.41; 315/111.21, 111.41, 111.51, 111.71; 219/121 PD, 121 PE, 121 PG, 121 PN, 121 PR, 121 PQ; 361/230; 204/192.2, 192.3, 192.32, 192.34; 156/345, 643

[56] References Cited

U.S. PATENT DOCUMENTS

| | | | |
|---|---|---|---|
| 3,230,418 | 1/1966 | Dandl et al. | 315/111.71 |
| 3,467,885 | 9/1969 | Cann | 315/111.71 |
| 3,527,977 | 9/1970 | Ruark | 315/111.71 X |
| 4,152,625 | 5/1974 | Conrad | 315/111.71 |
| 4,233,109 | 11/1980 | Nishizawa | 204/192.34 X |
| 4,351,712 | 9/1982 | Cuomo et al. | 204/192.34 |
| 4,559,100 | 12/1985 | Ninomiya et al. | 204/192.32 |

OTHER PUBLICATIONS

Microwave Ion Source by Sakudo et al. publ. Rev. Sci. Instrum., vol. 48, No. 7, Jul. 1977.
A New Production Technique: Ion Milling by Bollinger et al. publ. by Solid State Technology Nov. 1980.
Summary Abstract: Radio Frequency Ion Source Development for Neutral Beam Applications by Leung et al.
Journal of Vacuum Science Tech. Apr.-Jun. 1984.

*Primary Examiner*—L. T. Hix
*Assistant Examiner*—D. Rutledge
*Attorney, Agent, or Firm*—Antonelli, Terry & Wands

[57] ABSTRACT

In a high frequency plasma generation apparatus used in a reactive ion etching apparatus, an ion shower apparatus, a sputter apparatus, etc. for fabricating thin films or semiconductor devices for which a fine patterning process is required, electrical breakdown is apt to be provoked at the surface of a high frequency coil, because the high frequency coil is usually inserted in a plasma. In order to remove this drawback, according to this invention, the high frequency coil is disposed in the plasma production chamber at the neighborhood of the cylindrical side wall, and thus a plasma confinement domain is formed inside of this high frequency coil by use of a magnetic field production device which generates a multi-cusp magnetic field so that the plasma confinement domain is separated from the high frequency coil. In this way, electrical breakdown on the surface of the high frequency coil is prevented and thus the apparatus according to this invention can work stably for a long time.

6 Claims, 5 Drawing Figures

HIGH FREQUENCY PLASMA GENERATION APPARATUS

BACKGROUND OF THE INVENTION

This invention relates to a high frequency plasma generation apparatus, and in particular to a high frequency plasma generation apparatus suitable to a reactive ion etching apparatus, an ion shower apparatus, a sputter apparatus, etc. for fabricating thin films or semiconductor devices.

Recently it has been studied to utilize a high frequency plasma generation apparatus in a reactive ion etching apparatus, an ion shower apparatus, a sputter apparatus, etc. for fabricating then films or semiconductor devices for which a fine patterning process is required.

Plasma generation apparatuses known at the present time are ion sources for ion beam working apparatuses, in which arc discharge is maintained by thermal electron emission from a filament and plasma is generated with a high frequency by a magnetic field produced by a solenoid coil, from which plasma ions are extracted. Working apparatuses using this kind of ion sources are explained e.g. in "A New Production Technique: Ion Milling" by D. Bollinger and R. Fink, Solid State Technology, November 1980.

When this kind of plasma generation apparatus works with a reactive gas, long time work is difficult for the reasons that the filament is consumed excessively, that some gases make the electrodes dirty, etc.

In order to remove these drawbacks, it is sufficient to realize a plasma generation apparatus using no filament. Microwave plasma generation apparatuses are an example of this type of plasma generation apparatus. This kind of apparatus is explained in detail e.g. in "Microwave Ion Source" (N. Sakudo, et al., Rev. Sci. Instrum., Vol. 48, No. 7, July, 1977). In these microwave plasma generation apparatuses, plasma is produced by microwave electric power and provides a high quality ion beam suitable in particular for working semiconductor devices. However, they have drawbacks in that the apparatus is too complicated and that it is difficult to enlarge the diameter of the beam.

Further, another example of plasma generation apparatuses having no filament, are high frequency plasma generation apparatuses which have been reported in "Radio Frequency Ion Source Development for Neutral Beam Application" (K. H. Leung et al., J. vac. Sci. Technol. A2(2), April–June, 1984) as ion sources for neutral particle injection devices, which additionally heat plasma for nuclear fusion.

In such a high frequency plasma generation apparatus a plasma production chamber is formed by sealing the upper end of the cylindrical side wall with a back plate, and a high frequency coil is disposed at its central portion inside the chamber. Further, a starter filament and a gas inlet are introduced therein through this back plate and a permanent magnet, which generates a multi-cusp magnetic field, is disposed on the peripheral portion of the cylindrical side wall. In this way, plasma is produced by high frequency discharge by means of the high frequency coil disposed in the plasma production chamber and it is confined in a vessel by the multi-cusp magnetic field.

However, by this construction, since the high frequency coil is inserted in a plasma having an electric conductivity, electrical breakdown is apt to be produced at its surface by the high frequency electric field applied to the high frequency coil. This electrical breakdown can be prevented to a certain extent by an electrical insulation coating on the surface of the high frequency coil. However, the life of the coating exposed to a reactive gas is short and further the coating on the surface of the high frequency coil gives rise to a new problem in that the interior of the plasma producing chamber is polluted by gas released by the coating material.

SUMMARY OF THE INVENTION

This invention overcomes the problematical points stated above and its object is to provide a high frequency plasma generating apparatus to prevent electrical breakdown on the surface of the high frequency coil without providing an electrical insulation coating and to make the apparatus work stably for a long time.

This object can be achieved by the features of the present invention, in that a high frequency coil is disposed in a plasma generation chamber and is formed at the neighborhood of the cylindrical side wall by sealing hermetically the two extremities of the cylindrical side wall. The high frequency coil generates high frequency discharge by introducing gas for porducing ions by discharge and at the same time by feeding it with high frequency electric power. A plasma confinement domain is formed by a magnetic field producing means, which generates a multi-cusp magnetic field inside of the high frequency coil.

DESCRIPTION OF THE PREFERRED EMBODIMENTS

Figure 1:
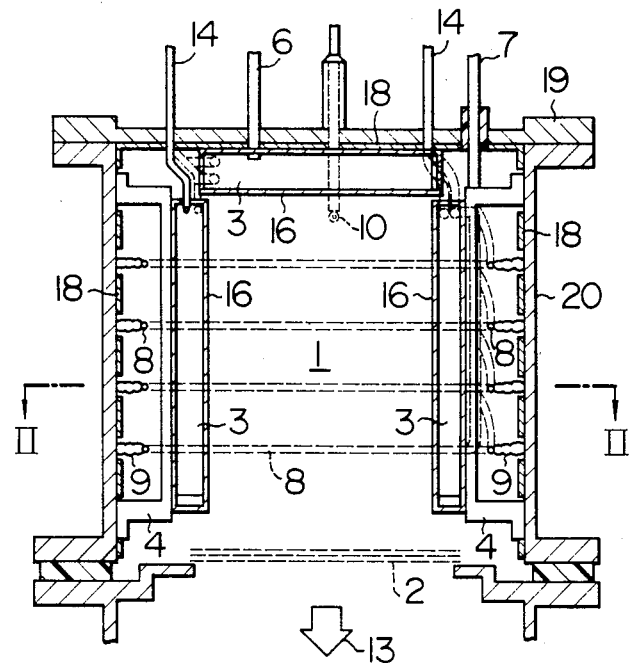
FIG. 1 is a longitudinal cross-sectional view of a high frequency plasma generation device according to an embodiment of this invention.

Hereinbelow some preferred embodiments of this invention will be explained, referring to the drawings.

FIG. 1 is a longitudinal cross-sectional view of a high frequency plasma generation apparatus, in which a plasma production chamber 1 is formed by sealing the upper end of the cylindrical side wall 20 with a back plate 19 and at the same time by sealing its lower end with a vessel not shown in the figure. To the side wall 20 is fixed an extremity of each of insulating supporters 9, on the other extremity of which a high frequency coil 8 is mounted. The high frequency coil 8 is located at the neighborhood of the side wall 20 and feeded with high frequency electric power through a bushing 7 introduced hermetically and electrically insulated through the back plate 19. Furthermore, magnetic bodies 18 such as soft magnetic ferrite are mounted on the inner surface of the side wall 20 and also the two legs of insulating supporters 4 disposed inside of the high frequency coil 8 are fixed thereto. On the inner surface of these supporters 4 and of the back plate 19 are mounted permanent magnets and a magnetic field generation means 3 in order to produce a multi-cusp magnetic field. The soft magnetic ferrite 18 stated above forms a magnetic return path for the high frequency magnetic field produced by the high frequency coils 8. Further the high frequency coil 8 consists of a round tube cooled by water or oil flowing therethrough.

Figure 2:
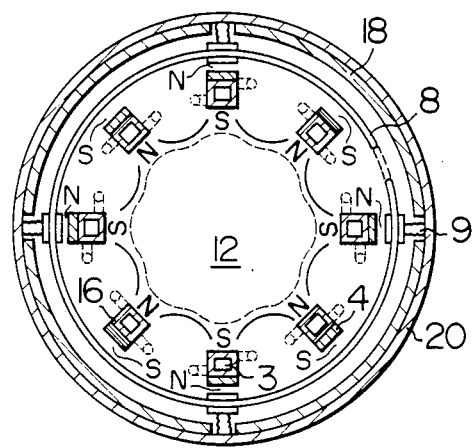
FIG. 2 is a cross-sectional view along II—II in FIG. 1.

The magnetic field production means 3 mentioned above is disposed in 8 rows in the plasma production chamber 1, as indicated in FIG. 2, which generates a multi-cusp magnetic field and forms a plasma confinement domain 12 indicated by a broken line in the figure. This plasma confinement domain 12 is located inside of the high frequency coil 8, which is protected against the plasma. Further the magnetic field production means 3 is located in a water or oil cooled case 16, which permits to avoid overheating due to plasma loss. The supply of this cooling medium is effected through a cooling medium introducing inlet 14 passing hermetically through the back plate 19. Furthermore a gas inlet tube 6 and a starter filament 10 pass hermetically through the back plate 19. Reactive gas such as $O_2$ is introduced through this gas inlet tube 6 and thermal electrons are emitted by heating the starter filament 10.

The working mode of the apparatus illustrated in FIGS. 1 and 2 will be explained below.

After having evacuated the plasma production chamber 1 to a vacuum of about $6.7 \times 10^{-4}$ Pa ($5 \times 10^{-6}$ Torr), reactive gas is introduced therein through the gas inlet tube 6 so that the pressure in the chamber 1 is about $1.3 \times 10^{-1} - 1.3$ Pa (1–10 m Torr). Then, thermal electrons are emitted by the starter filament 10 by heating it and at the same time, plasma of the reactive gas is produced in the plasma production chamber 1 by feeding the high frequency coil 8 with high frequency electric power of 13.56 MHz. After the plasma has been stabilized, power supply to the filament 10 is stopped. Elongation of the life of the starter filament 10 can be expected either by making it recoil from the plasma domain after the stop of the power supply or by replacing it by a discharge gap. The produced plasma has a tendency to diffuse towards the wall surface of the plasma production chamber 1, but it is confined within the domain 12 indicated in FIG. 2 by a multi-cusp magnetic field generated by a magnetic field production means 3. An ion beam 13 can be extracted from the plasma by applying a predetermined voltage to an electrodes 2 disposed in the bottom portion of the plasma production chamber 1.

As it is clear from the working mode explained above, in this embodiment, since the high frequency coil 8 is disposed outside of the plasma confinement domain 12 by means of the magnetic field production means 3, that is, since the high frequency coil is separated from the plasma confinement domain by the magnetic field, electrical breakdown on the surface of the high frequency coil due to the plasma is prevented without providing electrical insulation coating thereon. Consequently, the apparatus can work stably for a long time.

By using the apparatus described in this embodiment, plasma of $O_2$ gas was produced and an ion density of $0.8 - 1.0 \times 10^{11}$ (cm$^{-3}$) in the plasma was obtained. Further a beam of $O_2$ ions of 500 eV was extracted from the plasma and an ion beam current density of 0.65 mA/cm$^2$ was obtained. In addition, the maintenance interval, i.e. the period of time during which the apparatus can be used without maintenance, is 5 times as long as that for a prior art apparatus using a filament. As indicated above, the apparatus described in this embodiment can work stably for a long time, even if reactive gas is used in order to extract a large amount of ion beam, while preventing electrical breakdown on the surface of the high frequency coil 8. Further, since the plasma is confined in a determined plasma confinement domain 12 by the multi-cusp magnetic field, an almost uniform plasma can be obtained in spite of a large plasma confinement domain 12 and it is easy to enlarge the diameter of the beam. That is, enlargement of the diameter of the beam can be realized by increasing the number of the magnetic field production means 3 or making it stronger so as to obtain an intensity of the magnetic field, which is sufficient to confine the plasma.

Figure 3:
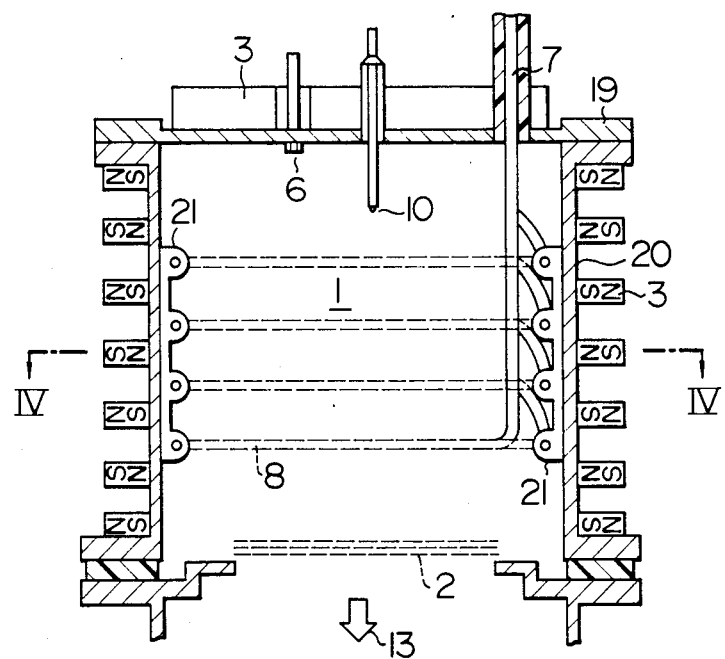
FIG. 3 is a longitudinal cross-sectional view of a high frequency plasma generation device according to another embodiment of this invention.

FIG. 3 illustrates another embodiment of the high frequency plasma production apparatus of this invention.

Figure 4:
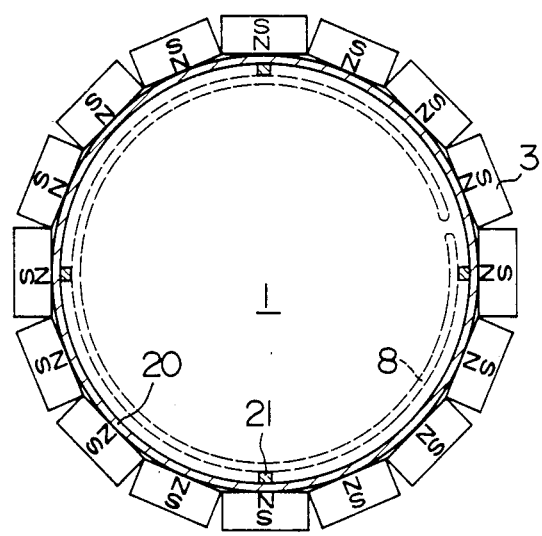
FIG. 4 is a cross-sectional view along IV—IV in FIG. 3.

In this embodiment, the magnetic field production means 3 for generating a multi-cusp magnetic field is disposed outside of the vessel forming the plasma production chamber 1. Further the magnetic field production means 3 have N poles and S poles disposed alternately along the axial direction on the side wall 20 and at the same time the poles of same polarity are arranged almost conintuously in the circumferential direction on the side wall, as indicated in FIG. 4. In the case indicated in the figure, the magnetic field production means 3 are arranged in a ring shape consisting of 7 layers with a predetermined interval in the axial direction on the side wall 20, and the high frequency coil 8 is so disposed that each turn is located between two adjacent layers at the neighborhood of the side wall 20 of the plasma production chamber 1 and fixed to the side wall 20 by an insulating supporter 21. The other constructions are identical to those described for the preceding embodiment. The identical or equivalent items are designated by same reference numerals and explanation more in detail therefor will be omitted.

Figure 5:
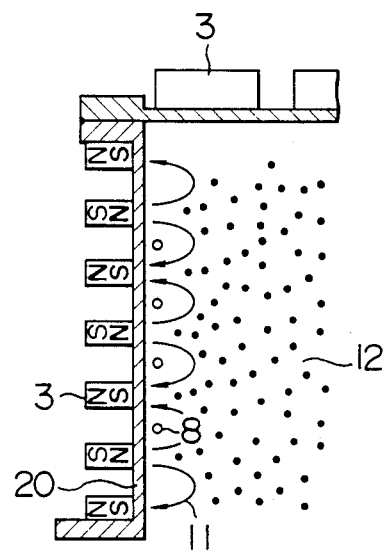
FIG. 5 shows schematically the principal part of FIG. 3 for explaining this invention.

FIG. 5 shows schematically the situation of the plasma confinement in the high frequency plasma production apparatus having the construction according to this embodiment. The magnetic field production means 3 disposed on the outer surface of the side wall 20 generates a magnetic field in the direction indicated by an arrow 11. Consequently, although the plasma generated by high frequency discharge has a tendency to diffuse towards the side wall 20, the diffusion is prevented by the magnetic field mentioned above and ions are confined in the domain 12 indicated by black points in the figure. In this way, electrical breakdown due to the plasma produced by the high frequency coil 8 can be prevented. Therefore, the same effects as those obtained in the preceding embodiment can be obtained also in this embodiment.

Further, the magnetic field production means 3 may be either an electromagnet or an permanent magnet, as stated previously, or still further their combination. In the case where a permanent magnet is used, it is desirable to use a magnet fabricated by moulding magnetic powder with resin, because heat production by the high frequency magnetic field is reduced in this way. Furthermore, the apparatus can be used as an etching apparatus or a sputtering apparatus, when the ion beam extraction electrode 2 is removed from the construction indicated in the embodiments stated above and material to be worked is brought directly into contact with the plasma or reactive radicals, and thus it can be widely utilized as a high frequency plasma generation appartus.

In addition, although examples, where only reactive gas is used, are described in the above embodiments, non-reactive gas can be also used.

By the high frequency plasma generation apparatus according to this invention, as explained above, since the plasma production chamber is formed by sealing hermetically the two extremities of its cylindrical side wall; a high frequency coil is disposed in the high frequency plasma generation chamber, which generates high frequency discharge by introducing gas for producing ions by discharge and at the same time by feeding it with high frequency electric power; and a magnetic field generation means producing a multi-cusp magnetic field for confining a plasma in the plasma production chamber is disposed at the neighborhood of the cylindrical side wall, the plasma is separated from the high frequency coil such that electrical breakdown on the surface of the high frequency coil due to the plasma is prevented and thus it is possible to obtain a high frequency plasma generation apparatus, which can work stably for a long time.

We claim:

1. A high frequency plasma generation apparatus comprising:

cylindrical wall means;

means for hermetically sealing two ends of said cylindrical wall means, so as to form a high frequency plasma production chamber within said cylindrical wall means;

means for introducing a gas into said high frequency plasma production chamber;

a high frequency coil, disposed in said high frequency plasma production chamber in the neighborhood of said cylindrical wall means, for providing high frequency electric power to said gas so as to produce a plasma; and magnetic field generation means for generating a multi-cusp magnetic field for producing a plasma confinement domain inside of said high frequency coil, wherein said plasma is confined within said plasma confinement domain so as to prevent contact between said plasma and said high frequency coil.

2. A high frequency plasma generation apparatus according to claim 1, in which said high frequency coil is mounted at an end of each of insulating supporters, the other end of said insulating supporters being fixed to said cylindrical wall means.

3. A high frequency plasma generation apparatus according to claim 1, in which said magnetic field generation means is disposed in said plasma production chamber inside of said high frequency coil and constructed so as to have poles whose polarity varies alternately in the circumferential direction of said wall means.

4. A high frequency plasma generation apparatus according to claim 3, in which said magnetic field generation means is provided with magnetic bodies forming magnetic return paths for said multi-cusp magnetic field inside of said cylindrical wall means.

5. A high frequency plasma generation apparatus according to claim 3, in which said magnetic field generation means is disposed in a cooled case.

6. A high frequency plasma generation apparatus according to claim 1, in which said magnetic field generation means is disposed on the outer surface of said cylindrical wall mean and constructed so as to have poles whose polarity varies alternately in the axial direction of said wall means and is unchanged almost continuously in the circumferential direction of said side wall.

* * * * *